United States Patent
Park et al.

(10) Patent No.: US 10,723,946 B2
(45) Date of Patent: Jul. 28, 2020

(54) ETCHANT AND METHOD OF MANUFACTURING DISPLAY DEVICE BY USING THE SAME

(71) Applicants: Samsung Display Co., Ltd., Yongin-si, Gyeonggi-do (KR); Dongwoo Fine-Chem Co., Ltd., Iksan-si, Jeollabuk-do (KR)

(72) Inventors: Jonghee Park, Yongin-si (KR); Kitae Kim, Yongin-si (KR); Jinseock Kim, Yongin-si (KR); Beomsoo Kim, Iksan-si (KR); Sangtae Kim, Iksan-si (KR); Kyungbo Shim, Iksan-si (KR); Giyong Nam, Iksan-si (KR); Youngjin Yoon, Iksan-si (KR); Daesung Lim, Iksan-si (KR)

(73) Assignees: Samsung Display Co., Ltd.., Yongin-si (KR); Dongwoo Fine-Chem Co., Ltd., Iksan-si (KR)

( * ) Notice: Subject to any disclaimer, the term of this patent is extended or adjusted under 35 U.S.C. 154(b) by 35 days.

(21) Appl. No.: 16/157,054

(22) Filed: Oct. 10, 2018

(65) Prior Publication Data

US 2019/0153318 A1    May 23, 2019

(30) Foreign Application Priority Data

Nov. 21, 2017    (KR) .................. 10-2017-0155816

(51) Int. Cl.
*C09K 13/06*    (2006.01)
*H01L 27/12*    (2006.01)
(Continued)

(52) U.S. Cl.
CPC .......... *C09K 13/06* (2013.01); *H01L 27/1259* (2013.01); *H01L 51/0017* (2013.01);
(Continued)

(58) Field of Classification Search
CPC . C09K 13/06; H01L 51/0017; H01L 51/0023; H01L 51/5218; H01L 51/56;
(Continued)

(56) References Cited

U.S. PATENT DOCUMENTS

| 7,141,180 B2 | 11/2006 | Park et al. |
| 8,366,958 B2 | 2/2013 | Chung et al. |

(Continued)

FOREIGN PATENT DOCUMENTS

| JP | 2008-534789 A | 8/2008 |
| JP | 2017-92439 A | 5/2017 |

(Continued)

*Primary Examiner* — Duy Vu N Deo
(74) *Attorney, Agent, or Firm* — Lewis Roca Rothgerber Christie LLP

(57) ABSTRACT

An etchant includes: based on a total weight of the etchant, about 1 wt % to about 15 wt % of sulfurized peroxide, about 5 wt % to about 10 wt % of nitric acid, about 20 wt % to about 40 wt % of organic acid, about 0.05 wt % to about 5 wt % of ferric nitrate, about 0.1 wt % to about 5 wt % of ionic sequestrant, and 0.1 wt % to 5 wt % of corrosion inhibitor, wherein a remaining amount is deionized water.

7 Claims, 4 Drawing Sheets

(51) Int. Cl.
*H01L 51/52* (2006.01)
*H01L 51/56* (2006.01)
*H01L 51/00* (2006.01)
*H01L 27/32* (2006.01)

(52) U.S. Cl.
CPC ...... *H01L 51/0023* (2013.01); *H01L 51/5218* (2013.01); *H01L 51/5234* (2013.01); *H01L 51/56* (2013.01); *H01L 27/3258* (2013.01); *H01L 27/3276* (2013.01); *H01L 51/5215* (2013.01); *H01L 51/5253* (2013.01)

(58) Field of Classification Search
CPC ............. H01L 51/5234; H01L 27/1259; H01L 51/5253; H01L 27/3276; H01L 51/5215; H01L 27/3258
See application file for complete search history.

(56) References Cited

U.S. PATENT DOCUMENTS

| | | | |
|---|---|---|---|
| 8,455,310 B2 | 6/2013 | Yim | |
| 9,221,114 B2 * | 12/2015 | Chen | ......................... H05K 3/22 |
| 2004/0072444 A1 | 4/2004 | Park et al. | |
| 2006/0278606 A1 | 12/2006 | Park et al. | |
| 2011/0233569 A1 | 9/2011 | Ko et al. | |
| 2015/0218709 A1 * | 8/2015 | Yoshizaki | ................ C09G 1/02 252/79.2 |
| 2016/0185595 A1 * | 6/2016 | Chen | ................ H01L 21/02063 216/13 |

FOREIGN PATENT DOCUMENTS

| | | |
|---|---|---|
| KR | 10-2004-0000801 A | 1/2004 |
| KR | 10-2006-0106087 A | 10/2006 |
| KR | 10-2009-0105781 A | 10/2009 |
| KR | 10-2010-0048144 A | 5/2010 |
| KR | 10-2013-0130515 A | 12/2013 |
| KR | 10-2014-0026645 A | 3/2014 |
| KR | 10-2014-0048045 A | 4/2014 |
| KR | 10-2014-0063283 A | 5/2014 |
| KR | 10-2014-0063284 A | 5/2014 |
| KR | 10-2014-0082246 A | 7/2014 |
| KR | 10-2014-0138571 A | 12/2014 |
| KR | 10-2016-0100591 A | 8/2016 |

* cited by examiner

ETCHANT AND METHOD OF MANUFACTURING DISPLAY DEVICE BY USING THE SAME

CROSS-REFERENCE TO RELATED APPLICATION

This application claims priority to and the benefit of Korean Patent Application No. 10-2017-0155816, filed on Nov. 21, 2017, in the Korean Intellectual Property Office, the entire content of which is incorporated herein by reference.

BACKGROUND

1. Field

One or more embodiments relate to an etchant and a method of manufacturing a display device by using the etchant.

2. Description of the Related Art

As displays for visually expressing various electrical signal information have developed, various flat panel display devices having excellent characteristics such as thinness, light weight, and low power consumption, are being researched and developed. In addition, an organic light-emitting display device has been attracting attention as a next generation display device due to its features such as wide viewing angle and fast response speed as well as its light weight and thinness.

Meanwhile, as the display area of a display device becomes increasingly larger, various wiring lines and electrodes included in the display device have to be formed of materials having a lowest possible specific resistance. To this end, the various wiring lines and electrodes included in the display device may include silver. However, a wiring line or an electrode, which includes the silver, may be weak in bonding strength with a layer or a film located on or under the wiring line or the electrode, and thus, in order to compensate for this problem, the wiring line or the electrode may include a multilayer film in which a film including silver and another conductive film is stacked.

Various wiring lines and electrodes included in a display device may be formed using a patterning process such as a photolithography process including an etching process. In this case, when a wiring line or an electrode includes a multilayer film in which films having different properties are stacked, there is a limit in forming the wiring line or the electrode having desired characteristics by using a simultaneous etching process. In addition, since other etchants used to etch wiring lines includes phosphoric acid, damage to other wiring lines in the display device may occur due to phosphoric acid during an etching process. Furthermore, through the above process, silver ions may be reduced and precipitated, and thus, defects may occur in a wiring line or an electrode due to silver particles. In order to prevent (or reduce) the generation of silver particles, a film including silver and another conductive film, included in a multilayer film, may be sequentially etched. However, in this case, the efficiency of manufacturing processes is remarkably deteriorated.

SUMMARY

One or more embodiments include an etchant that does not include phosphoric acid and is capable of being used to concurrently (e.g., simultaneously) etch a multilayer film including a silver film.

One or more embodiments include a method of manufacturing a display device by using the etchant.

Additional aspects of embodiments will be set forth in part in the description which follows and, in part, will be apparent from the description, or may be learned by practice of the presented embodiments.

According to one or more embodiments, an etchant includes: based on a total weight of the etchant, about 1 wt % to about 15 wt % of sulfurized peroxide; about 5 wt % to about 10 wt % of nitric acid; about 20 wt % to about 40 wt % of organic acid; about 0.05 wt % to about 5 wt % of ferric nitrate; about 0.1 wt % to about 5 wt % of ionic sequestrant; and about 0.1 wt % to about 5 wt % of corrosion inhibitor, wherein a remaining amount is deionized water.

The sulfurized peroxide may include at least one of ammonium persulfate, sodium persulfate, potassium persulfate, and oxone.

The organic acid may include at least one of acetic acid, citric acid, tartaric acid, malic acid, gluconic acid, glycolic acid, and formic acid.

The ionic sequestrant may include at least one of Iminodiacetic acid, penicillamine, nitrilotriacetic acid, ethylenediaminetetraacetic acid, N-(Hydroxyethyl)ethylenediaminetriacetic acid, ethylene glycol-bis(β-aminoethyl ether)-N,N,N',N'-tetraacetic acid, diethylenetriaminepentaacetic acid, 1,2-bis(β-aminophenoxy)ethane-N,N,N',N'-tetraacetic acid, and dimercaptosuccinic acid.

The corrosion inhibitor may include at least one of imidazole, pyrazole, benzotriazole, aminotetrazole, methyltetrazole, oxalic acid, and oxalate.

The oxalate may be sodium oxalate, potassium oxalate, or ammonium oxalate.

The etchant may concurrently (e.g., simultaneously) etch a silver film and a conductive film on or/and under the silver film.

According to one or more embodiments, a method of manufacturing a display device includes: forming a thin film transistor on a substrate; forming a planarization layer covering the thin film transistor; and forming a first electrode, electrically coupled to (or electrically connected to) the thin film transistor, on the planarization layer, wherein the first electrode has a structure in which a first conductive layer, a second conductive layer including silver, and a third conductive layer are stacked, wherein the first conductive layer and the third conductive layer are transparent or semitransparent electrode layers, and wherein the first electrode is etched and patterned with an etchant, wherein the etchant includes: based on a total weight of the etchant, about 1 wt % to about 15 wt % of sulfurized peroxide; about 5 wt % to about 10 wt % of nitric acid; about 20 wt % to about 40 wt % of organic acid; about 0.05 wt % to about 5 wt % of ferric nitrate; about 0.1 wt % to about 5 wt % of ionic sequestrant; about 0.1 wt % to about 5 wt % of corrosion inhibitor, and wherein a remaining amount is deionized water.

The sulfurized peroxide may include at least one of ammonium persulfate, sodium persulfate, potassium persulfate, and oxone.

The organic acid may include at least one of acetic acid, citric acid, tartaric acid, malic acid, gluconic acid, glycolic acid, and formic acid.

The ionic sequestrant may include at least one of Iminodiacetic acid, penicillamine, nitrilotriacetic acid, ethylenediaminetetraacetic acid, N-(Hydroxyethyl)ethylenediaminetriacetic acid, ethylene glycol-bis(β-aminoethyl ether)-N, N,N',N'-tetraacetic acid, diethylenetriaminepentaacetic acid, 1,2-bis(o-aminophenoxy)ethane-N,N,N',N'-tetraacetic acid, and dimercaptosuccinic acid.

The corrosion inhibitor may include at least one of imidazole, pyrazole, benzotriazole, aminotetrazole, methyltetrazole, oxalic acid, and oxalate.

The oxalate may be sodium oxalate, potassium oxalate, or ammonium oxalate.

The etchant may concurrently (e.g., simultaneously) etch the first conductive layer, the second conductive layer, and the third conductive layer.

The method may further include: forming a division area by removing a portion of the planarization layer, wherein a plurality of wiring lines for applying an electrical signal to the thin film transistor are exposed in the division area, and the first electrode is etched by the etchant in a state in which the plurality of wiring lines are exposed.

The plurality of wiring lines may be formed in a structure in which a first layer including titanium, a second layer including aluminum, and a third layer including titanium are stacked.

The thin film transistor may include an active layer, a gate electrode, a source electrode, and a drain electrode, wherein the plurality of wiring lines include a same (e.g., substantially the same) material as the source electrode and the drain electrode.

The method may further include: forming an intermediate layer and a second electrode on the first electrode, and forming a thin film encapsulation layer on the second electrode, wherein the thin film encapsulation layer includes an organic film and an inorganic film wider than the organic film.

The division area may divide the planarization layer into a central portion and an outer portion, wherein the inorganic film is formed to cover the outer portion.

The second conductive layer may further include an alloy element, and an atomic radius of the alloy element is equal to or less than that of the silver.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
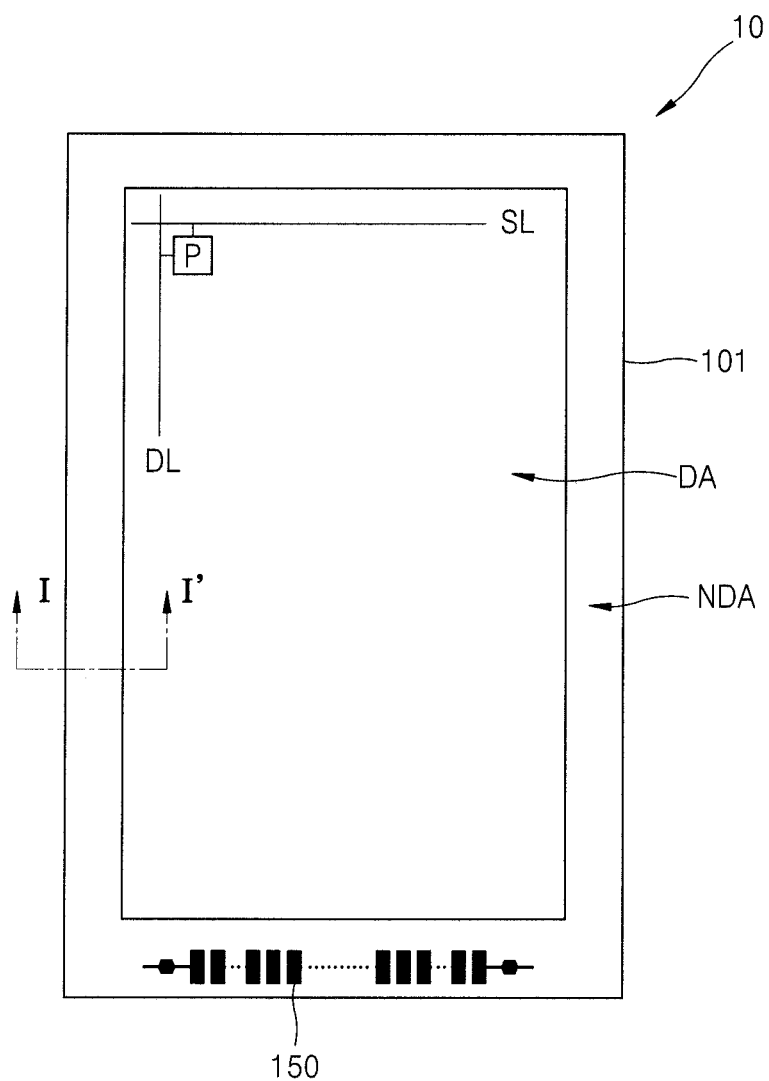
FIG. 1 is a plan view schematically illustrating a display device according to an embodiment.

Reference will now be made in more detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of embodiments of the present description. As used herein, the term "and/or" includes any and all combinations of one or more of the associated listed items. Expressions such as "at least one of" when preceding a list of elements, modify the entire list of elements and do not modify the individual elements of the list.

It will be understood that, although the terms first, second, etc. may be used herein to describe various elements, these elements should not be limited by these terms. These terms are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, area, or component is referred to as being "formed on," another layer, area, or component, it can be directly or indirectly formed on the other layer, area, or component. For example, intervening layers, areas, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same (e.g., substantially the same) time or performed in an order opposite to the described order.

Figure 2:
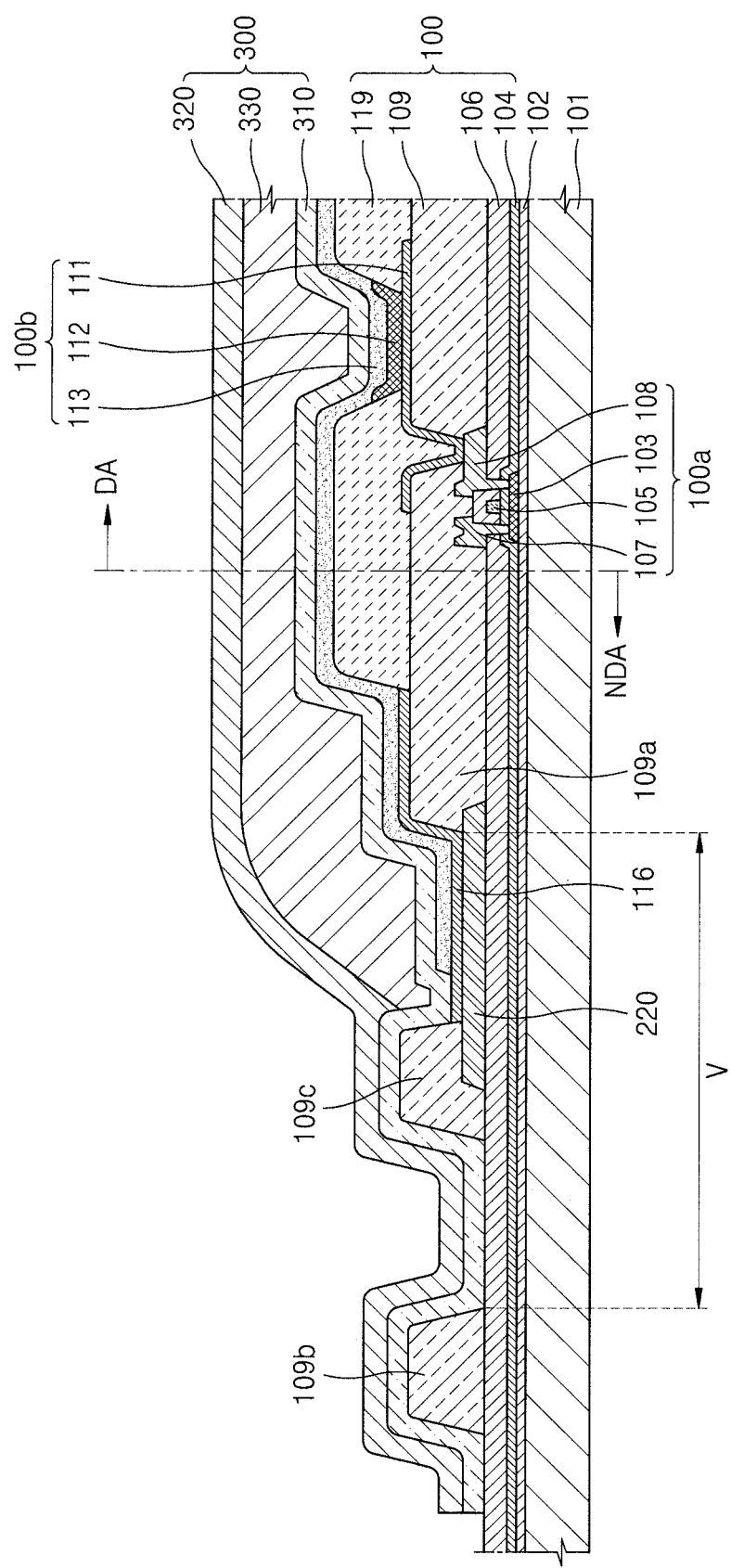
FIG. 2 is a cross-sectional view schematically illustrating an example of a cross section taken along a line I-I' shown in FIG. 1.
Figure 3:
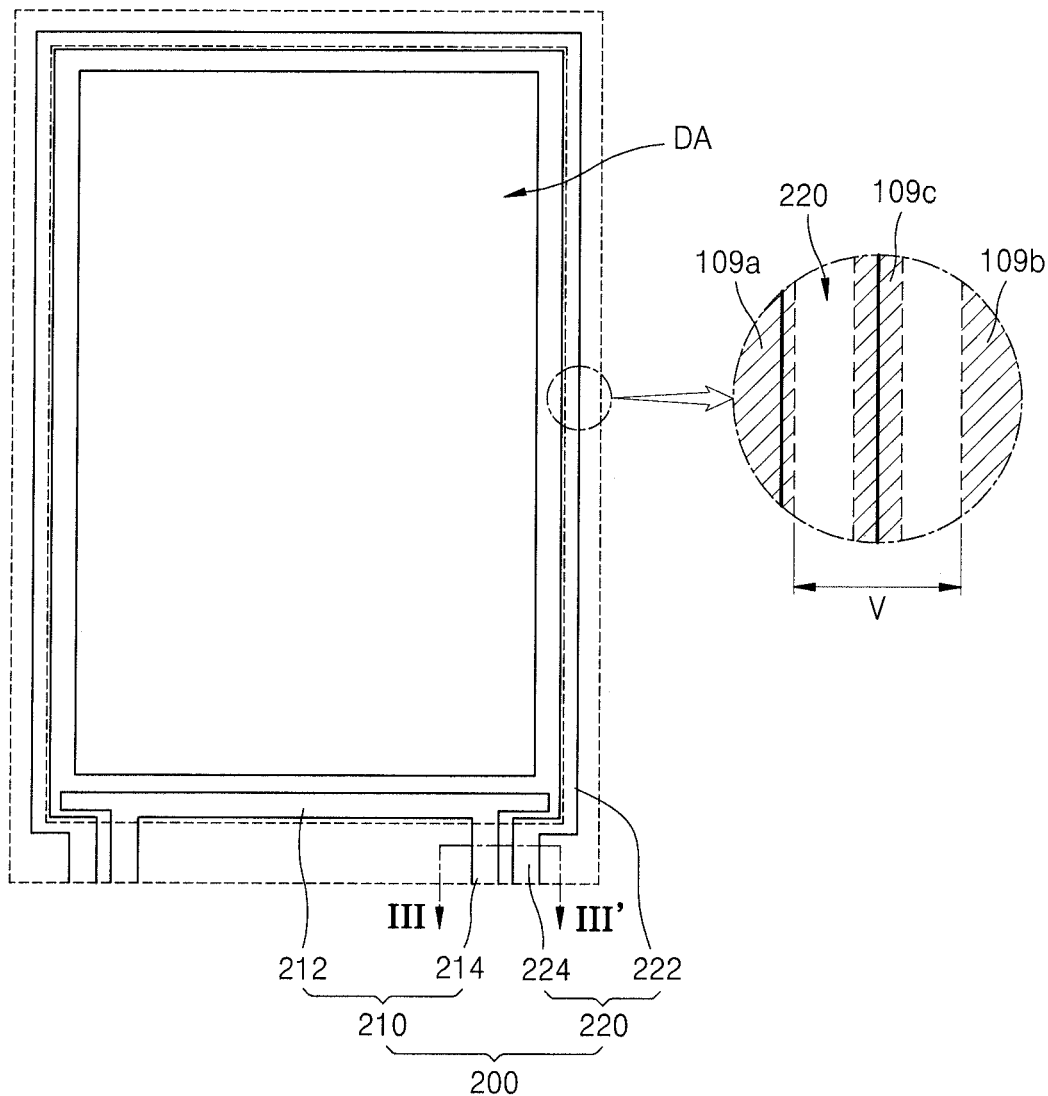
FIG. 3 is a plan view schematically illustrating a voltage line and a planarization layer of the display device of FIG. 1.
Figure 4:
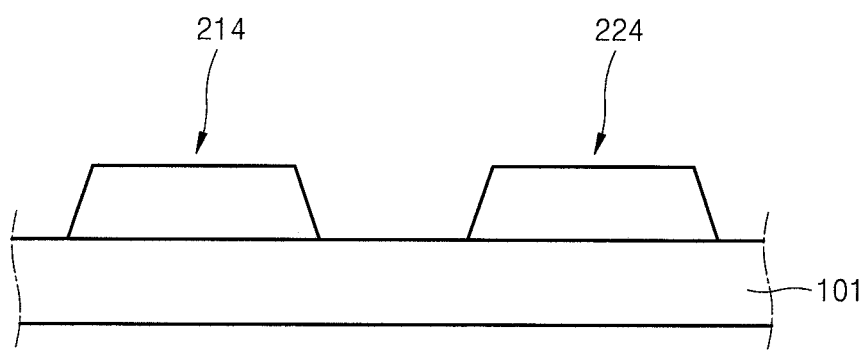
FIG. 4 is a cross-sectional view schematically illustrating an example of a cross section taken along a line III-III' shown in FIG. 3.

FIG. 1 is a plan view schematically illustrating a display device 10 according to an embodiment. FIG. 2 is a cross-sectional view schematically illustrating an example of a cross section taken along a line I-I' shown in FIG. 1. FIG. 3 is a plan view schematically illustrating a voltage line and a planarization layer of the display device 10 of FIG. 1. FIG. 4 is a cross-sectional view schematically illustrating an example of a cross section taken along a line III-III' shown in FIG. 3.

Hereinafter, the display device 10 and a manufacturing process thereof will be described with reference to FIGS. 1-4.

Referring to FIGS. 1-4, the display device 10 according to the present embodiment may include a substrate 101, a display unit 100 positioned on the substrate 101, and a thin film encapsulation layer 300. The display device 10 may be a flat panel display device.

The substrate 101 may include various suitable materials available in the art. For example, the substrate 101 may include a transparent glass material containing $SiO_2$ as a main component. However, the substrate 101 is not limited thereto, and may include a transparent plastic material. The plastic material may be polyethersulphone (PES), polyacrylate (PAR), polyetherimide (PEI), polyethylene naphthalate (PEN), polyethyleneterephthalate (PET) polyphenylene sulfide (PPS), polyallylate, polyimide, polycarbonate (PC), cellulose triacetate (TAC), cellulose acetate propionate (CAP), or the like.

In the case of a bottom emission type (or kind) in which an image is realized in a direction toward the substrate 101, the substrate 101 has to include a transparent material. However, in the case of a front emission type (or kind) in which an image is realized in a direction away from the substrate 101, the substrate 101 does not necessarily have to include a transparent material. In this case, the substrate 101 may include metal. When the substrate 101 includes metal, the substrate 101 may include iron, chromium, manganese, nickel, titanium, molybdenum, stainless steel (SUS), Invar alloy, Inconel alloy, Kovar alloy, or the like.

The display unit 100 is formed on the substrate 101. The display unit 100 may include a display area DA for realizing an image that may be recognized by a user, and a non-display area NDA around the display area DA.

A plurality of pixels P may be arranged in the display area DA. Each of the plurality of pixels P may be located at an intersection of a data line DL and a scan line SL, and a voltage line 200 for supplying power to a display element 100b or the like may be arranged in the non-display area NDA. The non-display area NDA may be provided with a pad unit 150 for transmitting an electrical signal from a power supply device or a signal generating device to the display area DA.

A buffer layer 102 may be formed on the substrate 101. The buffer layer 102 may provide a flat surface on the top of the substrate 101 and may block foreign substance or moisture penetrating through the substrate 101. For example, the buffer layer 102 may include an inorganic material such as silicon oxide, silicon nitride, silicon oxynitride, aluminum oxide, aluminum nitride, titanium oxide or titanium nitride, or an organic material such as polyimide, polyester, or acryl, or may include a laminate including a plurality of materials selected from the materials exemplified above.

A thin film transistor 100a and the display element 100b electrically coupled to (or electrically connected to) the thin film transistor 100a may be located on the substrate 101.

The thin film transistor 100a may include an active layer 103, a gate electrode 105, a source electrode 107 and a drain electrode 108. Hereinafter, a case in which the thin film transistor 100a is a top gate type (or kind) thin film transistor in which the active layer 103, the gate electrode 105, the source electrode 107 and the drain electrode 108 are sequentially formed will be described below. However, the present embodiment is not limited thereto, and various suitable types (or kinds) of thin film transistors such as a bottom gate type (or kind) thin film transistor may be employed as the thin film transistor 100a.

The active layer 103 may include a semiconductor material such as amorphous silicon or poly crystalline silicon. However, the present embodiment is not limited thereto, and the active layer 103 may include various suitable materials available in the art. In an additional or alternative embodiment, the active layer 103 may include an organic semiconductor material or the like. In another alternative embodiment, the active layer 103 may include an oxide semiconductor material. For example, the active layer 103 may include oxide of a Group 12, 13, or 14 metal element such as zinc (Zn), indium (In), gallium (Ga), tin (Sn), cadmium (Cd), or germanium (Ge), or oxide of a material selected from a combination thereof.

A gate insulating layer 104 is formed on the active layer 103. The gate insulating layer 104 may include a single layer film or a multi-layer film including an inorganic material such as silicon oxide and/or silicon nitride. The gate insulating layer 104 serves to insulate the active layer 103 from the gate electrode 105. The gate insulating layer 104 may extend not only to the display area DA but also to a part of the non-display area NDA.

The gate electrode 105 is formed on the gate insulating layer 104. The gate electrode 105 may be coupled to (or connected to) a gate line for applying an on/off signal to the thin film transistor 100a.

The gate electrode 105 may include a low-resistance metal material. For example, the gate electrode 105 may include a single layer or multiple layers of one or more materials selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer insulating layer 106 is formed on the gate electrode 105. The interlayer insulating layer 106 insulates the source electrode 107 and the drain electrode 108 from the gate electrode 105. The interlayer insulating layer 106 may extend not only to the display area DA but also to a part of the non-display area NDA.

The interlayer insulating layer 106 may include a single layer film or a multi-layer film including an inorganic material. For example, the inorganic material may be a metal oxide or a metal nitride. In some embodiments, the inorganic material may include silicon oxide ($SiO_2$), silicon nitride ($SiN_x$), silicon oxynitride (SiON), aluminum oxide ($Al_2O_3$), titanium oxide ($Ta_2O_5$), hafnium oxide ($HfO_2$), or zinc oxide ($ZrO_2$).

The source electrode 107 and the drain electrode 108 may be formed on the interlayer insulating layer 106. The source electrode 107 and the drain electrode 108 are in contact with the area of the active layer 103. Each of the source electrode 107 and the drain electrode 108 may include a single layer or multiple layers of one or more materials selected from among Al, Pt, Pd, Ag, Mg, Au, Ni, Ir, Cr, Li, Ca, Mo, Ti, W, and Cu. For example, each of the source electrode 107 and the drain electrode 108 may have a three-layered structure of Ti, Al, and Ti.

A planarization layer 109 is formed on the thin film transistor 100a. The planarization layer 109 eliminates a step caused by the thin film transistor 100a and prevents (or reduces) the display element 100b from being defective due to a bottom unevenness. The planarization layer 109 may include a single layer film or a multi-layer film including an organic material. The organic material may include a general purpose polymer such as polymethylmethacrylate (PMMA) or polystyrene (PS), a polymer derivative having a phenol group, an acrylic polymer, an imide polymer, an arylether polymer, an amide polymer, a fluorine polymer, a p-xylene polymer, a vinyl alcohol polymer, or a blend thereof. In addition, the planarization layer 109 may include a composite laminate including an inorganic insulating film and an organic insulating film.

The planarization layer 109 may include a division area V surrounding the display area DA in the non-display area NDA. The division area V may be formed by removing a part of the planarization layer 109 and may prevent (or reduce) moisture from penetrating into the display area DA along the planarization layer 109 including an organic material from the outside. The planarization layer 109 may be divided into a central portion 109a and an outer portion 109b by the division area V, and the central portion 109a may have a larger area than that of the display area DA.

The display element 100b is formed on the planarization layer 109. For example, the display element 100b may be an organic light-emitting device including a first electrode 111, a second electrode 113 opposed to the first electrode 111, and an intermediate layer 112 interposed between the first electrode 111 and the second electrode 113.

The first electrode 111 is formed on the planarization layer 109 and may be electrically coupled to (or electrically connected to) the thin film transistor 100a. The first electrode 110 may have various suitable shapes. For example, the first electrode 110 may be patterned in an island shape by photolithography.

The first electrode 110 may be a reflective electrode. For example, the first electrode 110 may include a reflective film including Ag, Mg, Al, Pt, Pd, Au, Ni, Nd, Ir, Cr, or a compound thereof and a transparent or semitransparent electrode layer formed on the reflective film. The transparent or semitransparent electrode layer may include at least one of indium tin oxide (ITO), indium zinc oxide (IZO), indium tin zinc oxide (ITZO), gallium zinc oxide (GZO), and indium gallium zinc oxide (IGZO).

For example, the first electrode 110 may have a structure in which a first conductive layer which is a transparent or semitransparent electrode layer, a second conductive layer which includes silver, and a third conductive layer which is a transparent or semitransparent electrode layer are stacked. Furthermore, the second conductive layer including silver may further include an alloy element having an atomic radius equal to or less than that of silver, in order to prevent (or reduce) an agglomeration phenomenon of silver. The alloy element may include at least one selected from among Zn, Ni, cobalt (Co), Cu, Ga, Ge, Pt, antimony (Sb), manganese (Mn), W, and Mo.

The second electrode 113 may be a transparent or semitransparent electrode and may include a metal thin film which has a small work function and includes Li, Ca, LiF/Ca, LiF/Al, Al, Ag, Mg, or a compound thereof. Furthermore, an auxiliary electrode layer or a bus electrode may be further formed on the metal thin film by using a material for the formation of a transparent electrode, for example, ITO, IZO, ZnO, or $In_2O_3$. Therefore, the second electrode 113 may transmit light emitted from an organic emission layer included in the intermediate layer 112. For example, light emitted from the organic emission layer may be reflected directly or reflected by the first electrode 110 formed as a reflective electrode and the reflected light may be emitted toward the second electrode 113.

However, the display unit 100 according to the present embodiment is not limited to a front emission type (or kind), and may be a back emission type (or kind) in which light emitted from an organic emission layer is emitted toward the substrate 101. In this case, the first electrode 110 may be a transparent or semitransparent electrode, and the second electrode 113 may be a reflective electrode. Also, the display unit 100 according to the present embodiment may be a double-sided emission type (or kind) in which light is emitted in both the front and back directions.

A pixel defining layer 119 is formed on the first electrode 110 as an insulator. The pixel defining layer 119 may be formed by a method such as spin coating by using at least one organic insulating material selected from the group consisting of polyimide, polyamide, acrylic resin, benzocyclobutene, and phenol resin. The pixel defining layer 119 exposes a set (e.g., predetermined) region of the first electrode 110, and the intermediate layer 112 including an organic emission layer is located in the exposed region. For example, the pixel defining layer 119 defines a pixel region of the organic light-emitting device.

The organic emission layer in the intermediate layer 112 may include low molecular organic matter or polymer organic matter. The intermediate layer 112 may optionally further include functional layers such as a hole transport layer (HTL), a hole injection layer (HIL), an electron transport layer (ETL), and an electron injection layer (EIL), in addition to the organic emission layer.

In the non-display area NDA, the voltage line 200 and the division area V dividing the planarization layer 109 into the central portion 109a and the outer portion 109b may be arranged. At least a portion of the voltage line 200 may be positioned in the division area V. For example, the voltage line 200 may be partially exposed in the division area V.

The voltage line 200 may include a first voltage line 210 and a second voltage line 220. For example, the first voltage line 210 may be a first power source voltage ELVDD line, and the second voltage line 220 may be a second power source voltage ELVSS line. In FIG. 2, the second voltage line 220 is coupled to (or connected to) the second electrode 113 via a wiring line 116. However, the present embodiment is not limited thereto, and the second voltage line 220 may be in direct contact with the second electrode 113.

The first voltage line 210 may include a first main voltage line 212 arranged to correspond to one side of the display area DA, and a first connection portion 214. For example, when the display portion DA is rectangular, the first main voltage line 212 may be arranged to correspond to any one side of the display area DA. The first main voltage line 212 may be parallel (e.g., substantially parallel) to any one side of the display area DA and may have a length equal to or greater than that of the one side of the display area DA. Any one side of the of the display area DA, which corresponds to the first main voltage line 212, may be a side adjacent to the pad unit 150.

The first connection portion 214 may protrude from the first main voltage line 212 in a first direction and cross the division area V. Here, the first direction is a direction from the display area DA to the pad part 150, and the first connection portion 214 may be connected to the pad unit 150. The first main voltage line 212 may be covered by the central portion 109a, but the first connection portion 214 may be exposed in the division area V until at least a process of forming the intermediate layer 112 is completed.

The second voltage line 220 may include a second main voltage line 222 surrounding both ends of the first main voltage line 212 and the remaining areas of the display area DA, and a second connection portion 224 that protrudes from the second main voltage line 222 in the first direction and crosses the division area V. The second connection portion 224 may be coupled to (e.g., connected to) the pad unit 150, and may be exposed in the division area V until at least the process of forming the intermediate layer 112 is completed.

The voltage line 200 may be formed using the same (e.g., substantially the same) material as the source electrode 107 and the drain electrode 108. For example, the voltage line 200 may have a structure in which a first layer including Ti, a second layer including Al, and a third layer including Ti are stacked. Since Al has an etching rate higher than that of Ti, when the side of the voltage line 200 is exposed in the division area V, damage may occur in the second layer including Al during a process, for example, during a process of patterning the first electrode 111. For example, when the first electrode 111 is etched using another etchant including phosphoric acid, the second layer including Al may be excessively etched to thereby cause a defect in the third layer including Ti, and thus, as the step coverage of the voltage line 200 is lowered, damage such as a crack may occur in the thin film encapsulation layer 300, which is in contact with the voltage line 200, in the division area V.

In addition, electrons may be generated by the etching of the second layer including A, and the generated electrons may be combined with silver ions present in the etchant to thereby reduce silver ions, and thus, silver particles may be adsorbed on the first connection portion 214 or the second connection portion 214. The adsorbed silver particles may be transferred to the first electrode 111 by a cleaning process or the like. Therefore, the first electrode 111 may be defective due to the silver particles.

In the division area V in which the first connection portion 214 and the second connection portion 224 are exposed, wiring lines for applying electrical signal to the display area DA may also be exposed. The wiring lines may apply electrical signals to the thin film transistor 100a. For example, the wiring lines may couple (e.g., connect) the pad unit 150 and a data line DL, and the wiring lines may also be formed using the same (e.g., substantially the same) material as the source electrode 107 and the drain electrode 108. For example, each of the wiring lines may have a structure in which a first layer including Ti, a second layer including Al, and a third layer including Ti are stacked. Therefore, during a process of etching the first electrode 111, the wiring lines exposed in the division area V may also be damaged by an etchant and silver particles may be reabsorbed on the wiring lines.

In order to prevent (or reduce) this phenomenon, according to the present embodiment, the first electrode 111 is etched using an etchant including metal oxide and sulfurized peroxide instead of phosphoric acid to thereby prevent or suppress generation of silver particles during a process of etching the first electrode 111. Such an etchant will be described later.

A dam portion 109c may be formed in the division area V. The dam portion 109c may prevent (or reduce) an organic material from flowing toward the edge of the substrate 101 when an organic film 330 of the thin film encapsulation layer 300 for sealing the display unit 100 is formed, and thus may prevent (or reduce) an edge tail of the organic film 330 from being formed.

The dam portion 109c may overlap the outer edge of the second main voltage line 222 to thereby covering the outer surface of the second main voltage line 222. In addition, the central portion 109a may overlap the inner edge of the second main voltage line 222 to thereby cover the inner surface of the second main voltage line 222. Therefore, both sides of the second main voltage line 222 may be prevented from being exposed to an etching environment (or a likelihood or amount of such exposure may be reduced).

The dam portion 109c may be formed in the same (e.g., substantially the same) layer as the planarization layer 109 and include the same (e.g., substantially the same) material as the planarization layer 109. However, the present embodiment is not limited thereto, and the dam portion 109c may include two or more layers. For example, when the dam 109c has a two-layered structure, a lower layer may include the same (e.g., substantially the same) material as the planarization layer 109 and an upper layer may include the same (e.g., substantially the same) material as the pixel defining layer 119. A plurality of dam portions 109c may be formed as needed. When a plurality of dam portions 109c are formed, the height of the dam portions 109c may be increased toward the outer portion of the substrate 101.

The thin film encapsulation layer 300 may seal the display unit 100 to prevent (or reduce) external oxygen and moisture from penetrating into the display unit 100. The thin film encapsulation layer 300 may include at least one inorganic film 310 and 320 and at least one organic film 330. Although FIG. 2 illustrates an example in which the thin film encapsulation layer 300 includes two inorganic films 310 and 320 and one organic film 330 alternately stacked each other, the present embodiment is not limited thereto. For example, the thin film encapsulation layer 300 may further include a plurality of additional inorganic encapsulation films and organic encapsulation films alternately arranged, and the number of times the inorganic encapsulation film and the organic encapsulation film are stacked is not limited.

The organic film 330 may include at least one selected from the group consisting of acrylic resin, methacrylic resin, polyisoprene, vinyl resin, epoxy resin, urethane resin, cellulose resin, and perylene resin.

The inorganic films 310 and 320 may include at least one selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

Since the dam portion 109c prevents (or reduces) an organic material from flowing toward the edge of the substrate 101 when the organic film 330 is formed, the organic film 330 is positioned inside the dam portion 109c. In contrast, the inorganic films 310 and 320 may be formed to be larger than the organic film 330 and cover the outer portion 109b. Therefore, the division area V is covered by the inorganic films 310 and 320. The inorganic films 310 and 320 may extend to the outside of the outer portion 109b, and the inorganic films 310 and 320 may contact each other outside the outer portion 109b.

Hereinafter, an etchant that may be used to etch the first electrode 111 will be described in more detail. Hereinafter, for convenience of explanation, the first electrode 111 is described as having an electrode structure in which a transparent conductive film, a silver film, and another transparent conductive film are stacked. However, an etchant according to an embodiment may also be used to etch a single film including silver or silver alloy.

The etchant according to the embodiment may include, based on the total weight of the etchant, about 1 wt % to about 15 wt % of sulfurized peroxide, about 5 wt % to about 10 wt % of nitric acid, about 20 wt % to about 40 wt % of organic acid, about 0.05 wt % to about 5 wt % of ferric nitrate, about 0.1 wt % to about 5 wt % of ionic sequestrant, and about 0.1 wt % to about 5 wt % of corrosion inhibitor, and a remaining amount is deionized water.

The sulfurized peroxide is a component that is used as a main etchant, and serves to perform a wet etching by oxidizing silver. The sulfurized peroxide may be included in the etchant in an amount ranging from about 1 wt % to about 15 wt % based on the total weight of the etchant. When the content of the sulfurized peroxide is less than 1 wt %, the etching rate of silver may be lowered and a defect in an etching profile may be caused and silver re-adsorption may increase. When the content of the sulfurized peroxide exceeds 15 wt %, the etch rate of silver becomes too fast, and thus, a tip may occur in a transparent conductive film located on or/and under a silver film and a wiring defect may occur due to over-etching of the silver film. The sulfurized peroxide may include at least one of ammonium persulfate, sodium persulfate, potassium persulfate, and oxone.

The nitric acid is a component that is used as an oxidant, and serves to perform a wet etching by oxidizing the silver film and the transparent conductive film. The content of the nitric acid may be about 5 wt % to about 10 wt % based on the total weight of the etchant. When the content of the nitric acid is less than 5 wt %, the etching rates of the silver film and the transparent conductive film may be lowered, and thus, the uniformity of etching may be lowered according to the position of a substrate (e.g., the substrate 101 in FIG. 1) and spots may occur in a display device (e.g., the display device 10 in FIG. 1). On the other hand, when the content of the nitric acid exceeds 10 wt %, the etching rate of the transparent conductive film may be accelerated, and thus, an undercut may occur in the transparent conductive film located on or/and under the silver film and the undercut may cause problems in a subsequent process.

The organic acid is a component that adjusts pH with an auxiliary oxidant and a buffer solution, and serves to perform a wet etching by oxidizing silver and adjust pH of the etchant. The organic acid may be included in the etchant in an amount of about 20 wt % to about 40% based on the total weight of the etchant. When the content of the organic acid is less than 20 wt %, the etching rate may not be uniform according to the position of the substrate (e.g., the substrate 101 in FIG. 1), thereby causing unevenness. On the other hand, when the content of the organic acid exceeds 40 wt %, bubbles may be generated and complete etching may not be performed, and thus, problems may be caused in a subsequent process and Ag re-adsorption may occur. In addition, when the content of the organic acid exceeds 40 wt %, excessive pH decrease may occur and thus over-etching may occur due to an increase in etching rate. The organic acid may include at least one of acetic acid, citric acid, tartaric acid, malic acid, gluconic acid, glycolic acid, and formic acid.

The ferric nitrate is a component that is used as an auxiliary oxidant and a silver ligand, and reduces the re-adsorption of silver upon wet etching and also controls the etching rate so as to etch uniformly (e.g., substantially uniformly). The content of the ferric nitrate may be about 0.05 wt % to about 5% based on the total weight of the etchant. When the content of the ferric nitrate is less than 0.05 wt %, the etching uniformity may be lowered and a silver residue may partially occur. When the content of the ferric nitrate exceeds 5 wt %, the etching rate may be increased and thus over-etching may occur.

The ionic sequestrant is a component that controls the etching rate so as to be uniformly (e.g., substantially uniformly) etched when silver is etched, and the content of the ionic sequestrant may be about 0.1 wt % to about 5 wt % based on the total weight of the etchant. When the content of the ionic sequestrant is less than 0.1 wt %, a tip may occur in the transparent conductive film due to an etching rate difference between the silver film and an upper transparent conductive film, i.e., the transparent conductive film located on the silver film. When the content of the ionic sequestrant exceeds 5 wt %, a silver residue may occur due to excessive etching rate degradation. The ionic sequestrant may include at least one of Iminodiacetic acid, penicillamine, nitrilotriacetic acid, ethylenediaminetetraacetic acid, N-(2-Hydroxyethyl)ethylenediaminetriacetic acid, ethylene glycol-bis(β-aminoethyl ether)-N,N,N',N'-tetraacetic acid, diethylenetriaminepentaacetic acid, 1,2-bis(o-aminophenoxy)ethane-N,N,N',N'-tetraacetic acid, and dimercaptosuccinic acid.

The corrosion inhibitor is a component that controls the etching rate so as to be uniformly (e.g., substantially uniformly) etched when silver is etched, and the content of the corrosion inhibitor may be about 0.1 wt % to about 5 wt % based on the total weight of the etchant. When the content of the corrosion inhibitor is less than 0.1 wt %, the etching rate of the silver film may be too high to cause over-etching. When the content of the corrosion inhibitor exceeds 5 wt %, a silver residue may occur due to an excessive decrease in the etching rate of the silver film. The corrosion inhibitor may include at least one of imidazole, pyrazole, benzotriazole, aminotetrazole, methyltetrazole, oxalic acid, and oxalate. The oxalate may be sodium oxalate, potassium oxalate, or ammonium oxalate.

Table 1 below shows results of patterning the first electrode 111 in FIG. 1 by using the etchant according to the present embodiment. The evaluation criteria of evaluation items in Table 1 are as follows.

Evaluation Criteria of Silver Etching Amount
  ◉: Most excellent (unilateral etching distance: ≤0.3 μm)
  ○: Excellent (unilateral etching distance: ≤0.5 μm, >0.3 μm)
  Δ: Good (unilateral etching distance: ≤1 μm, >0.5 μm)
  X: Bad (unilateral etching distance: >1 μm)

Evaluation Criteria of Silver Re-Adsorption
  ◉: Excellent (25 or less)
  X: Bad (more than 25)

Evaluation Criteria of Upper Transparent Conductive Film Tip
  ◉: No occurrence of tip—Excellent
  X: Occurrence of tip—Bad Evaluation Criteria of Silver Residue
  ◉: No occurrence of residue—Excellent
  X: Occurrence of residue—Bad

TABLE 1

| | | Oxone (wt %) | Nitric acid (wt %) | Acetic acid (wt %) | Ferric nitrate (wt %) | IDA (wt %) | Sodium oxalate (wt %) | silver etching amount | silver re-adsorption | upper film tip | silver residue |
|---|---|---|---|---|---|---|---|---|---|---|---|
| Embodiment | 1 | 5 | 9 | 30 | 0.1 | 2 | 2 | ○ | ◉ | ◉ | ◉ |
| | 2 | 2 | 9 | 30 | 0.1 | 2 | 2 | ◉ | ○ | ◉ | ◉ |
| | 3 | 14 | 9 | 30 | 0.1 | 2 | 2 | ○ | ◉ | ◉ | ◉ |
| | 4 | 5 | 6 | 30 | 0.1 | 2 | 2 | ◉ | ○ | ◉ | ◉ |
| | 5 | 5 | 9 | 22 | 0.1 | 2 | 2 | ◉ | ○ | ◉ | ◉ |
| | 6 | 5 | 9 | 38 | 0.1 | 2 | 2 | ○ | ◉ | ◉ | ◉ |
| | 7 | 5 | 9 | 30 | 4.5 | 2 | 2 | ○ | ◉ | ◉ | ◉ |
| | 8 | 5 | 9 | 30 | 0.1 | 0.5 | 2 | ○ | ◉ | ◉ | ◉ |
| | 9 | 5 | 9 | 30 | 0.1 | 4.5 | 2 | ◉ | ○ | ◉ | ◉ |
| | 10 | 5 | 9 | 30 | 0.1 | 2 | 0.5 | ○ | ◉ | ◉ | ◉ |
| | 11 | 5 | 9 | 30 | 0.1 | 2 | 4.5 | ◉ | ○ | ◉ | ◉ |
| Comparative example | 1 | 0.5 | 9 | 30 | 0.1 | 2 | 2 | ◉ | X | ◉ | X |
| | 2 | 18 | 9 | 30 | 0.1 | 2 | 2 | X | ◉ | X | ◉ |
| | 3 | 5 | 4 | 30 | 0.1 | 2 | 2 | ◉ | X | X | X |

TABLE 1-continued

|  | Oxone (wt %) | Nitric acid (wt %) | Acetic acid (wt %) | Ferric nitrate (wt %) | IDA (wt %) | Sodium oxalate (wt %) | silver etching amount | silver re-adsorption | upper film tip | silver residue |
|---|---|---|---|---|---|---|---|---|---|---|
| 4 | 5 | 12 | 30 | 0.1 | 2 | 2 | X | ◎ | ◎ | ◎ |
| 5 | 5 | 9 | 15 | 0.1 | 2 | 2 | ◎ | X | ◎ | X |
| 6 | 5 | 9 | 50 | 0.1 | 2 | 2 | X | ◎ | X | ◎ |
| 7 | 5 | 9 | 30 | 0 | 2 | 2 | ◎ | ◎ | ◎ | X |
| 8 | 5 | 9 | 30 | 6 | 2 | 2 | X | ◎ | X | ◎ |
| 9 | 5 | 9 | 30 | 0.1 | 0 | 2 | Δ | ◎ | X | ◎ |
| 10 | 5 | 9 | 30 | 0.1 | 6 | 2 | ◎ | X | ◎ | X |
| 11 | 5 | 9 | 30 | 0.1 | 2 | 0 | X | ◎ | ◎ | ◎ |
| 12 | 5 | 9 | 30 | 0.1 | 2 | 6 | ◎ | X | ◎ | X |

As may be seen from Table 1, the etchant according to the present disclosure has fine etching uniformity with respect to the first electrode 111 in FIG. 1, which has a structure in which a transparent conductive film, a silver film, and another transparent conductive film are stacked.

Figure 5A:
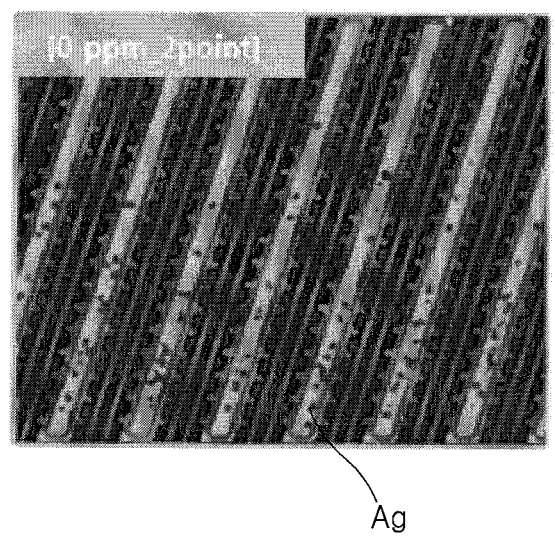
FIGS. 5A-5B show results of re-absorption of silver particles on wiring lines exposed in a division area during the etching of a first electrode in FIG. 1.
Figure 5B:
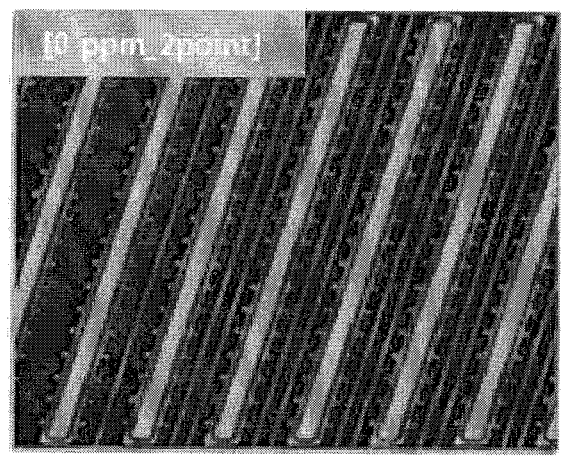

FIGS. 5A-5B show results of re-absorption of silver particles on wiring lines exposed in the division area V during the etching of the first electrode 111 in FIG. 1. For example, FIG. 5A shows a result of using another etchant including phosphoric acid, and FIG. 5B shows a result of using the etchant of Embodiment 1 shown in Table 1 above.

As may be seen from FIGS. 5A-5B, when the first electrode 111 in FIG. 1 is etched using the etchant according to the present disclosure, damage to wiring lines exposed to the etchant may be prevented (or reduce), and thus, as the re-adsorption of silver is reduced, defects of the first electrode 111 due to silver particles may be prevented (or reduced).

According to one or more embodiments, the etchant does not include phosphoric acid and precipitation of silver may be prevented (or reduced) in a concurrent (e.g., simultaneous) etching process for a multilayer film including a silver film. However, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An etchant comprising:
    based on a total weight of the etchant,
    about 1 wt % to about 15 wt % of sulfurized peroxide;
    about 5 wt % to about 10 wt % of nitric acid;
    about 20 wt % to about 40 wt % of organic acid;
    about 0.05 wt % to about 5 wt % of ferric nitrate;
    about 0.1 wt % to about 5 wt % of ionic sequestrant; and
    about 0.1 wt % to about 5 wt % of corrosion inhibitor,
    wherein a remaining amount is deionized water.

2. The etchant of claim 1, wherein the sulfurized peroxide comprises at least one of ammonium persulfate, sodium persulfate, potassium persulfate, and oxone.

3. The etchant of claim 1, wherein the organic acid comprises at least one of acetic acid, citric acid, tartaric acid, malic acid, gluconic acid, glycolic acid, and formic acid.

4. The etchant of claim 1, wherein the ionic sequestrant comprises at least one of Iminodiacetic acid, penicillamine, nitrilotriacetic acid, ethylenediaminetetraacetic acid, N-(Hydroxyethyl)ethylenediaminetriacetic acid, ethylene glycol-bis(β-aminoethyl ether)-N,N,N',N'-tetraacetic acid, diethylenetriaminepentaacetic acid, 1,2-bis(o-aminophenoxy)ethane-N,N,N',N'-tetraacetic acid, and dimercaptosuccinic acid.

5. The etchant of claim 1, wherein the corrosion inhibitor comprises at least one of imidazole, pyrazole, benzotriazole, aminotetrazole, methyltetrazole, oxalic acid, and oxalate.

6. The etchant of claim 5, wherein the oxalate is sodium oxalate, potassium oxalate, or ammonium oxalate.

7. The etchant of claim 1, wherein the etchant concurrently etches a silver film and a conductive film on or/and under the silver film.

\* \* \* \* \*